(12) United States Patent
Chen et al.

(10) Patent No.: US 7,449,382 B2
(45) Date of Patent: Nov. 11, 2008

(54) MEMORY DEVICE AND FABRICATION METHOD THEREOF

(75) Inventors: Meng-Hung Chen, Taoyuan (TW);
 Shian-Jyh Lin, Taipei County (TW);
 Neng-Tai Shih, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 402 days.

(21) Appl. No.: 11/441,313

(22) Filed: May 24, 2006

(65) Prior Publication Data
 US 2007/0166914 A1 Jul. 19, 2007

(30) Foreign Application Priority Data
 Jan. 17, 2006 (TW) .............................. 95101701 A

(51) Int. Cl.
 *H01L 21/8242* (2006.01)

(52) U.S. Cl. ...................... 438/244; 438/243; 438/386; 438/396; 257/296; 257/301

(58) Field of Classification Search ................. 438/239, 438/243, 244, 253, 386, 387, 396; 257/295, 257/296, 301
See application file for complete search history.

(56) References Cited

U.S. PATENT DOCUMENTS 6,897,508 B2 * 5/2005 Sneh ........................... 257/301
7,075,134 B2 * 7/2006 Paz de Araujo et al. ..... 257/295

\* cited by examiner

*Primary Examiner*—Fernando L Toledo
(74) *Attorney, Agent, or Firm*—Quintero Law Office

(57) ABSTRACT

A memory device is disclosed. A substrate is provided. A plurality of pillars is disposed on the substrate. Each pillar has a plurality of epitaxial layers, has a first sidewall and a second sidewall. A trench is formed between the pillars. A common bottom electrode is disposed in a lower portion of the trench and surrounded by a node dielectric layer. A first insulating layer is disposed on the common bottom electrode inside the trench. A plurality of gate structures is disposed on the first sidewall and inside the trench. A second insulating layer is disposed inside the trench and adjacent to the gate structures. A third insulating layer, body line, and fourth insulating layer are respectively disposed on the substrate and located between the second insulating layer and the second sidewall.

40 Claims, 17 Drawing Sheets

MEMORY DEVICE AND FABRICATION METHOD THEREOF

BACKGROUND OF THE INVENTION

1. Field of the Invention

The invention relates to a memory device, and in particular to a method of fabricating a memory device.

2. Description of the Related Art

Reduced size, high speed performance and large memory capacity are important for dynamic random access memory (DRAM).

Most DRAMs, used as a memory device, with capacity exceeding 256 or 512 MB, comprise transistors and capacitors. Higher integration is needed for a high-capacity high-speed DRAM as the size thereof decreases.

Memory devices with surrounding gate transistors (SGTs) have more memory cells than other conventional memory devices in 55 nm or other small-scale process, and can exhaust charges in the on-mode. However, the floating body effect also appears in the off-mode.

Thus, an improved method for fabricating a memory device with reduced floating body effect is called for.

BRIEF SUMMARY OF THE INVENTION

A detailed description is given in the following embodiments with reference to the accompanying drawings.

In an embodiment, a method of fabricating a memory device is provided. A substrate is provided. A plurality of pillars is formed on the substrate. Each pillar has a plurality of epitaxial layers, has a first sidewall and a second sidewall, and is sequentially defined to form a first source/drain region, a channel region, and a second source/drain region from a bottom of each pillar. A trench is disposed between the pillars, and the first source/drain region act as a top electrode. A node dielectric layer is formed on the first sidewall and the second sidewall, in a lower portion of the trench, and adjacent to the top electrode. A common bottom electrode is formed in a lower portion of the trench and surrounded by the node dielectric layer. A first insulating layer is formed on the common bottom electrode inside the trench. A double layer is formed on the first sidewall and the second sidewall, above the first insulating layer, and inside the trench. The double layer comprises a gate dielectric layer and a gate conductive layer. A second insulating layer is formed in a space surrounded by the double layer inside the trench. A portion of the double layer is removed on the first sidewall to form a plurality of slots on the first sidewall and a plurality of gate structures on the second sidewall. A third insulating layer is formed in a lower portion of the slots. A body line is formed on the third insulating layer inside the slots. The slots are filled with a fourth insulating layer.

A memory device is also provided. A substrate is provided. A plurality of pillars is disposed on the substrate. Each pillar has a plurality of epitaxial layers, a first sidewall and a second sidewall, and is sequentially defined to form a first source/drain region, a channel region, and a second source/drain region from a bottom of each pillar. The first source/drain region acts as a top electrode. A trench is disposed between the pillars. A node dielectric layer is disposed in a lower portion of the trench and adjacent to the top electrode. A common bottom electrode is disposed in a lower portion of the trench and surrounded by the node dielectric layer. A first insulating layer is disposed on the common bottom electrode inside the trench. A plurality of gate structures is disposed on the first sidewall and inside the trench. A second insulating layer is disposed inside the trench and adjacent to the gate structures. A third insulating layer, body line, and fourth insulating layer are respectively disposed on the substrate and located between the second insulating layer and the second sidewall.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
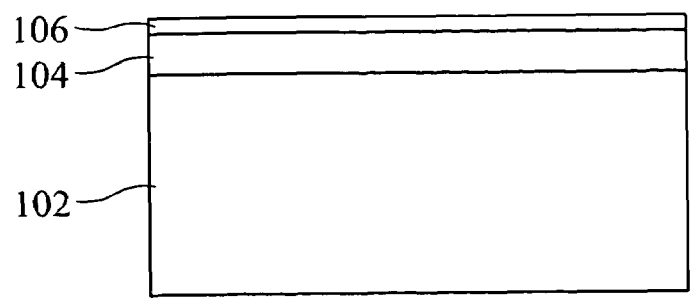
FIGS. 1, 2, 3B and 4 are cross sections of a memory device according to the invention.

Referring to FIG. 1, a semiconductor substrate is provided. The substrate can be silicon-on-insulator (SOI) substrate comprising an N type silicon substrate 102, silicon dioxide layer 104, and silicon layer 106.

Figure 2:
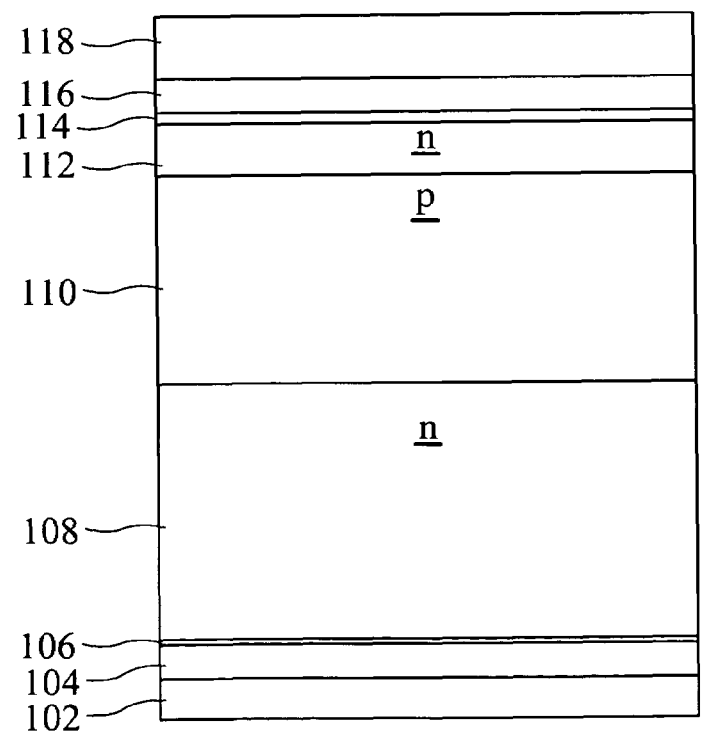

Referring to FIG. 2, epitaxial layers are formed on the semiconductor substrate using epitaxial growth. For example, a first N type epitaxial silicon layer 108, P type epitaxial silicon layer 110, and second N type epitaxial silicon layer 112 are respectively formed on the silicon layer 106. Thick wafer implantation is used to form a p-well, and lithography and ion implantation are used to form source/drain regions during fabrication.

After the epitaxial layers are formed, a silicon oxide pad layer 114 and silicon nitride pad layer 116 are respectively formed on the second N type epitaxial silicon layer 112. The pad layer 114 can be used as a buffer layer for the pad layer 116 and the second N type epitaxial silicon layer 112. The pad layer 116 can be used as an etching stop layer or hard mask. A mask 118, such as boron silicate glass (BSG), is deposited on the pad layer 116.

Figure 3A:
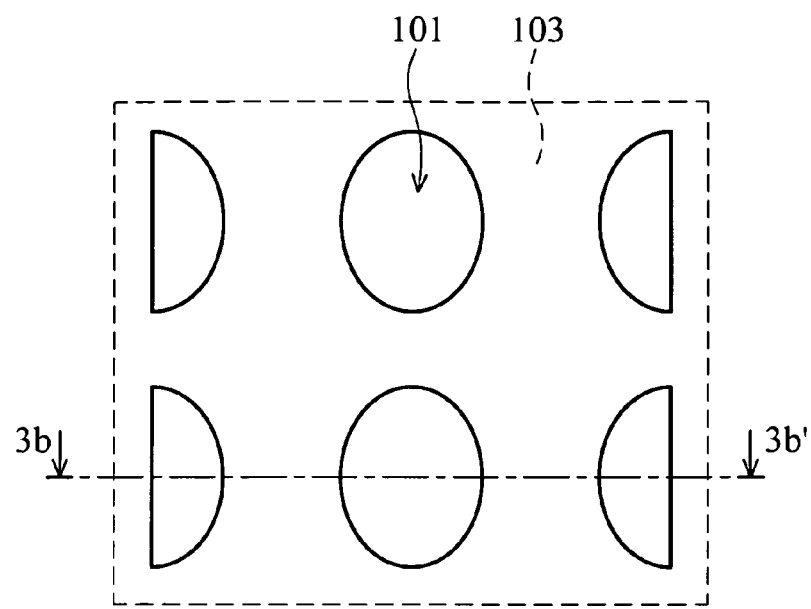
FIG. 3A is a top view of a layout of a memory device according to the invention.
Figure 3B:
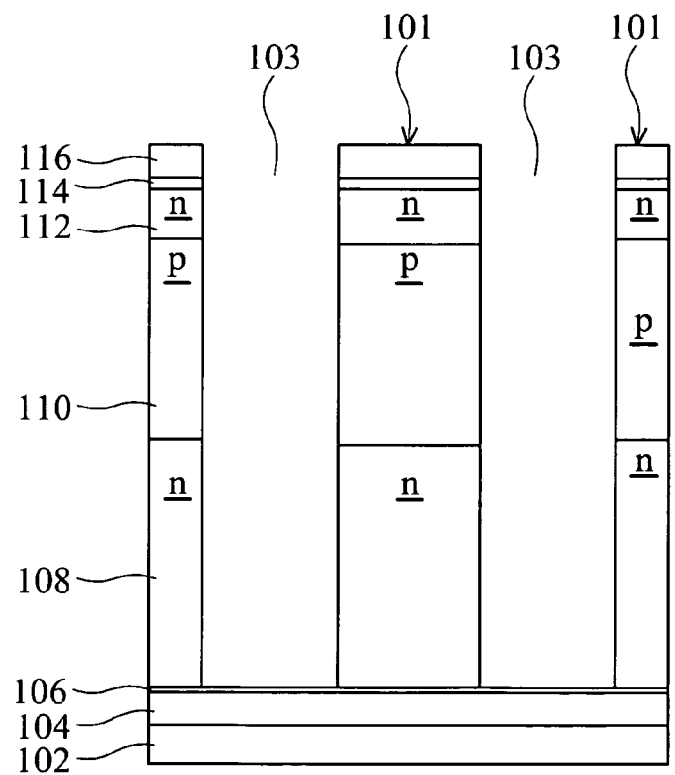

FIG. 3A is a top view of a layout of a memory device according to the invention, and FIG. 3B is a cross section of a structure shown in FIG. 3A along the lines 3b to 3b'. Capacitors can be defined by lithography and etching. For example, a photoresist layer (not shown) is formed on the mask 118 (shown in FIG. 2) and patterned by lithography and etching. The mask 118 and pad layers 114 and 116 are patterned to form openings using the patterned photoresist layer as a mask. The epitaxial layers, such as the second N type epitaxial silicon layer 112, the P type epitaxial silicon layer 110, and the first N type epitaxial silicon layer 108 are etched through the openings to expose the silicon layer 106.

After the epitaxial layers are etched, a plurality of pillars 101 is formed, and a trench 103 is formed between the pillars 101. Each pillar 101 is a portion of a vertical transistor. For example, epitaxial layer 112 may act as a first source/drain region, epitaxial layer 108 may act as a second source/drain region and a top electrode of a capacitor, and epitaxial layer 110 may act as a channel region.

Figure 4:
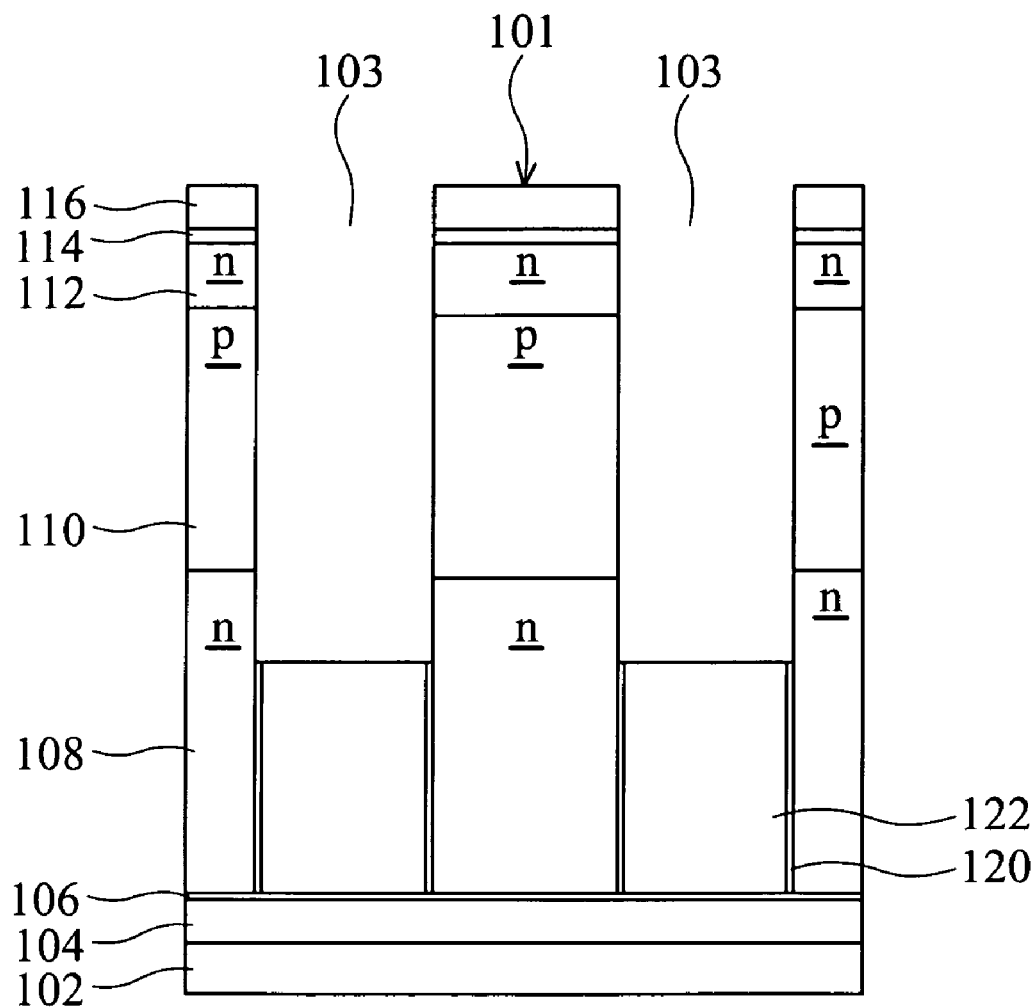

Referring to FIG. 4, after the pillars 101 are formed, a node dielectric layer 120, a common bottom electrode 122, and other components (not shown) are formed inside the trench 103.

In one embodiment, a node dielectric layer 120, such as an oxide formed by deposition, is formed on a sidewall of the epitaxial layer 108 and on the substrate. A common bottom electrode 122 is formed in a lower portion of the trench and surrounded by the node dielectric layer 120. For example, the common bottom electrode 122 is formed by depositing a polysilicon layer to fill the trench and cover the substrate, planarizing the polysilicon layer, and recessing a portion of the polysilicon layer. The remaining polysilicon layer acts as the common bottom electrode 122 and has a top surface lower than that of the epitaxial layer 108 to prevent the common bottom electrode 122 and the epitaxial layer 110 from contact. Lithography and ion implantation can be performed on remaining polysilicon layer to form the common bottom electrode 122.

Figure 5:
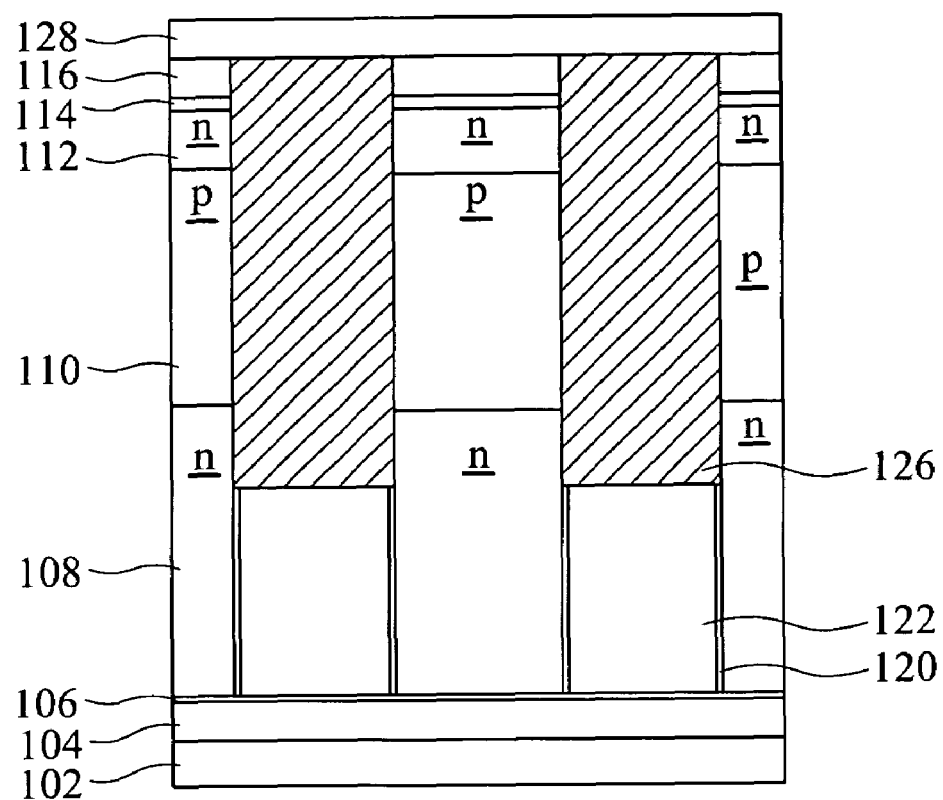
FIG. 5 is a cross section of a structure shown in FIG. 3A along the lines 3b to 3b'.

Referring to FIG. 5, an insulating material 126 is formed on the common bottom electrode 122 inside the trench 103. For example, a silicon oxide material is deposited on the substrate to fill the trench 103, and the silicon oxide material is planarized to expose the pad layer 116, and a mask 128 is formed on the pillars 101 and the insulating material 126. The mask 128 can be silicon nitride.

Figure 6A:
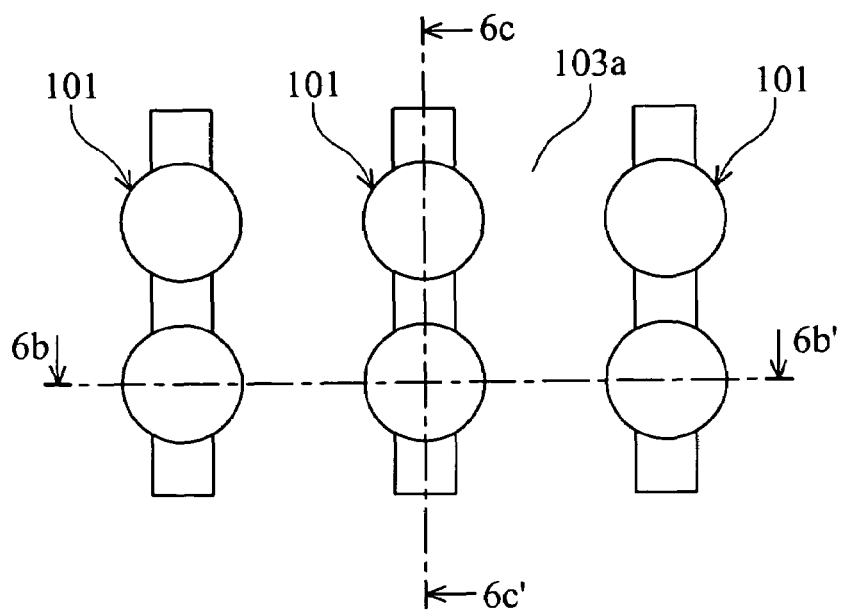
FIGS. 6A, 7A, 8A, 9A, 10A and 11A are respective top views of layouts of a memory device according to the invention.
Figure 6B:
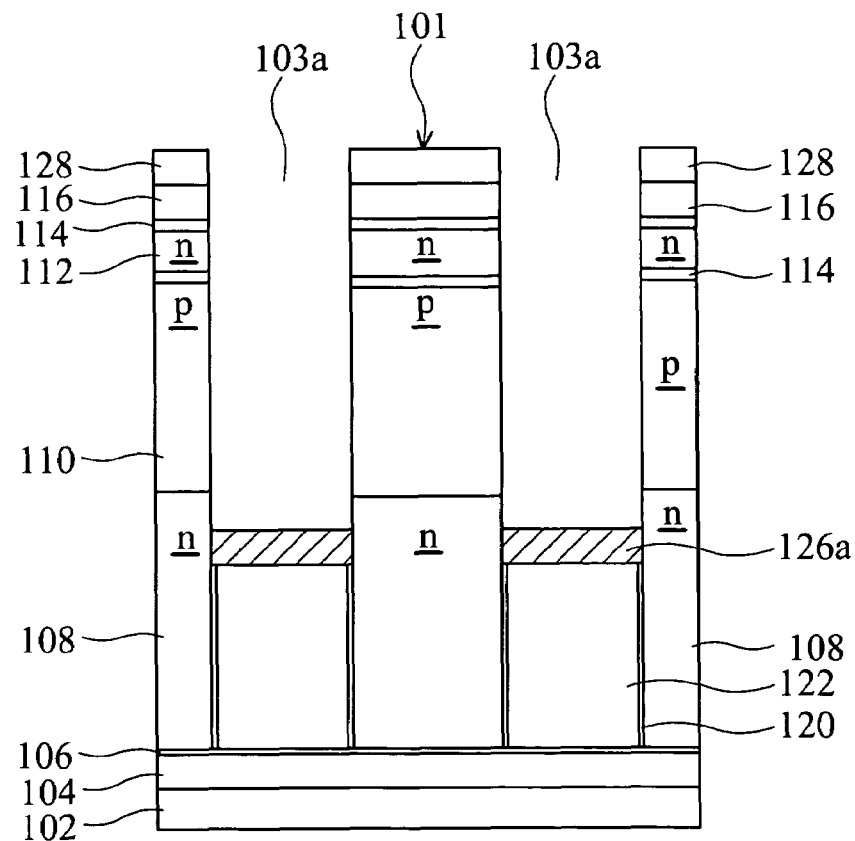
FIGS. 6B, 7B, 8B, 9B, 10B and 11B are respective cross sections of structures shown in FIGS. 6A, 7A, 8A, 9A, 10A and 11A along the lines 6b to 6b', 7b to 7b', 8b to 8b', 9b to 9b', 10b to 10b', and 11b to 11'.
Figure 6C:
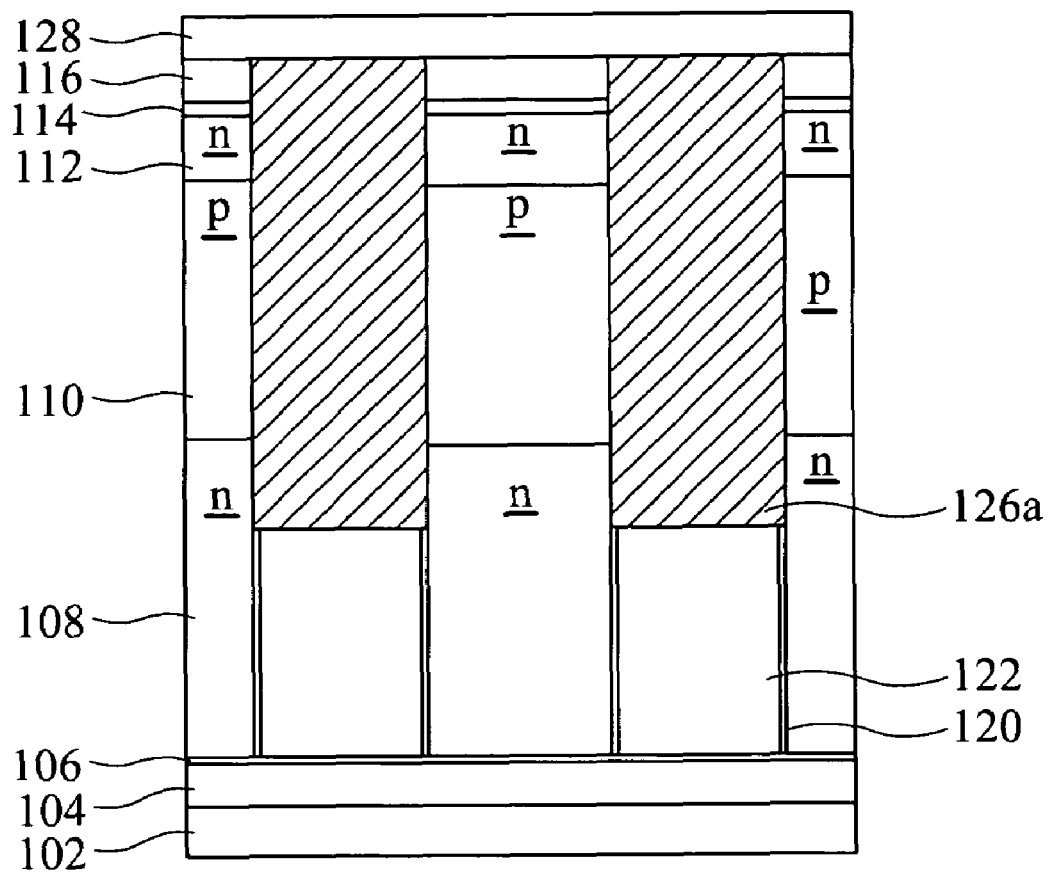
FIGS. 6C, 7C, 8C, 9C, 10C and 11C are respective cross sections of structures shown in FIGS. 6A, 7A, 8A, 9A, 10A and 11A along the lines 6c to 6c', 7c to 7c', 8c to 8c', 9c to 9c', 10c to 10c', and 11c to 11c'.

FIG. 6A is a top view of a layout of a memory device according to the invention, FIG. 6B is a cross section of a structure shown in FIG. 6A along the lines 6*b* to 6*b'*, and FIG. 6C is a cross section of a structure shown in FIG. 6A along the lines 6*c* to 6*c'*.

As shown in FIG. 6B, the mask 128 is patterned, a insulating layer 126*a* and a trench 103*a* are formed. In one embodiment, the mask 128 is patterned to form an opening, the insulating material 126 is recessed through the opening, and the insulating layer 126*a* is formed to prevent the common bottom electrode 122 and other components from electrically connecting. In this embodiment, the insulating layer 126*a* has a top surface lower than that of the epitaxial layer 108.

Figure 7A:
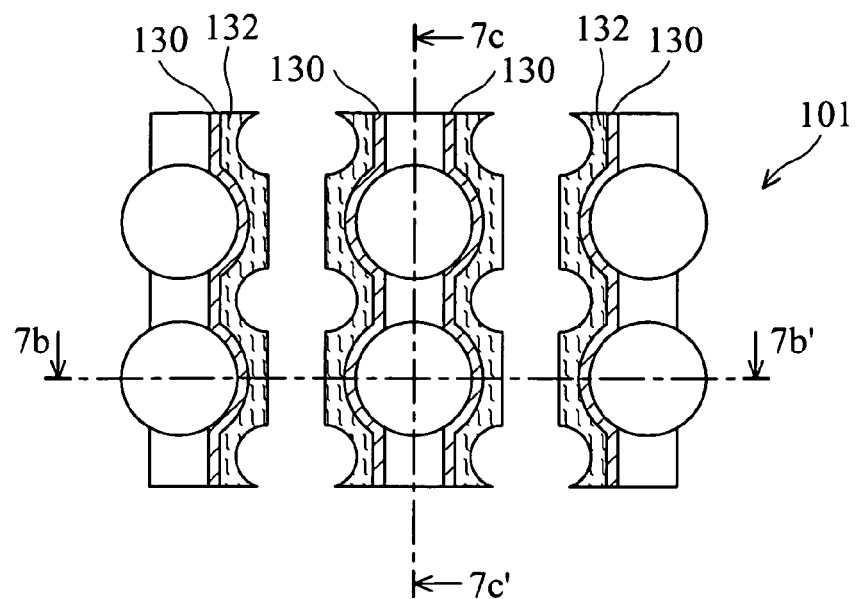
Figure 7B:
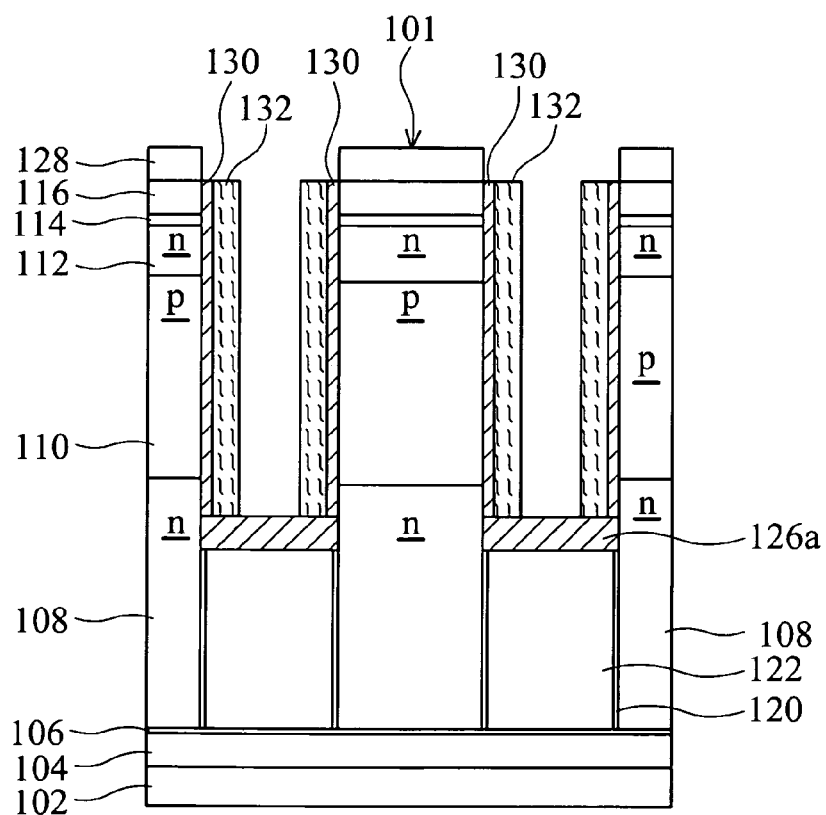
Figure 7C:
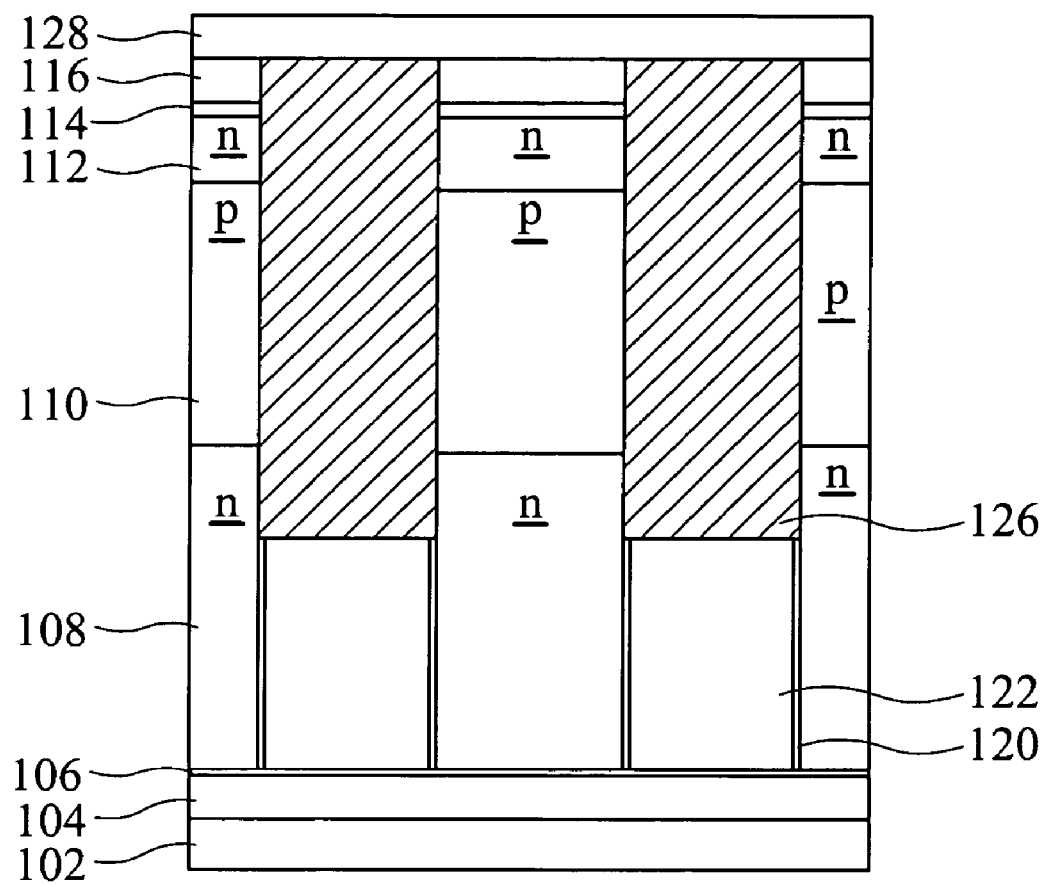

FIG. 7A is a top view of a layout of a memory device according to the invention, FIG. 7B is a cross section of a structure shown in FIG. 7A along the lines 7*b* to 7*b'*, and FIG. 7C is a cross section of a structure shown in FIG. 7A along the lines 7*c* to 7*c'*.

In one embodiment, a double layer is formed on a sidewall of the pillars 101 and inside the trench, and the double layer comprises a gate dielectric layer 130 and a gate conductive layer 132. For example, the gate dielectric layer 130, such as a silicon oxide layer formed by oxidation, is formed on the left sidewall (referred to as a first sidewall) and on the right sidewall of the pillars 101 (referred to as a second sidewall), a polysilicon material is filled into the trench, a mask is formed (not shown) and patterned, and the polysilicon material is etched to form the gate conductive layer 132. preferably, the gate conductive layer 132 has a top surface lower than that of the mask 128.

Figure 8A:
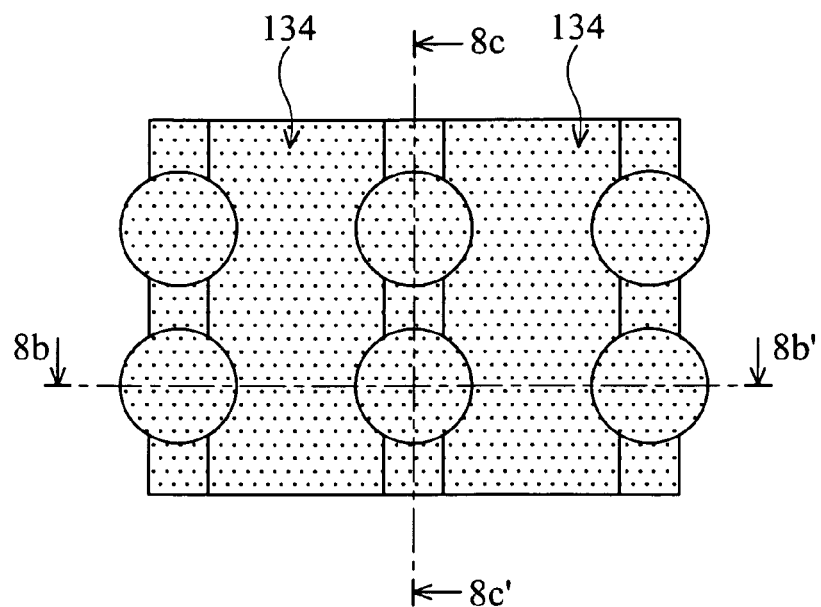
Figure 8B:
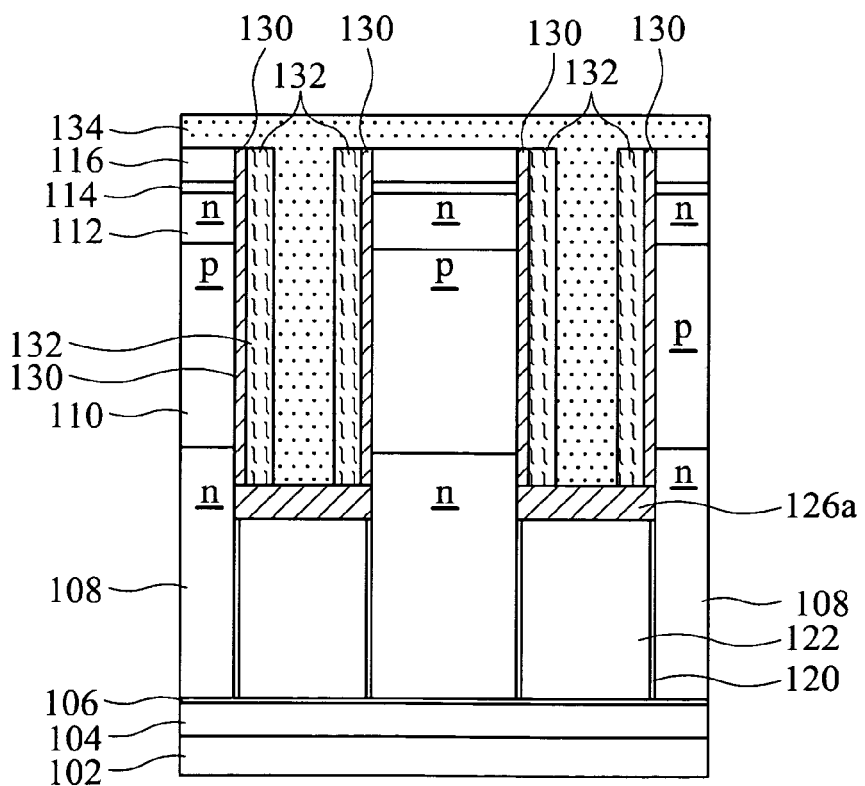
Figure 8C:
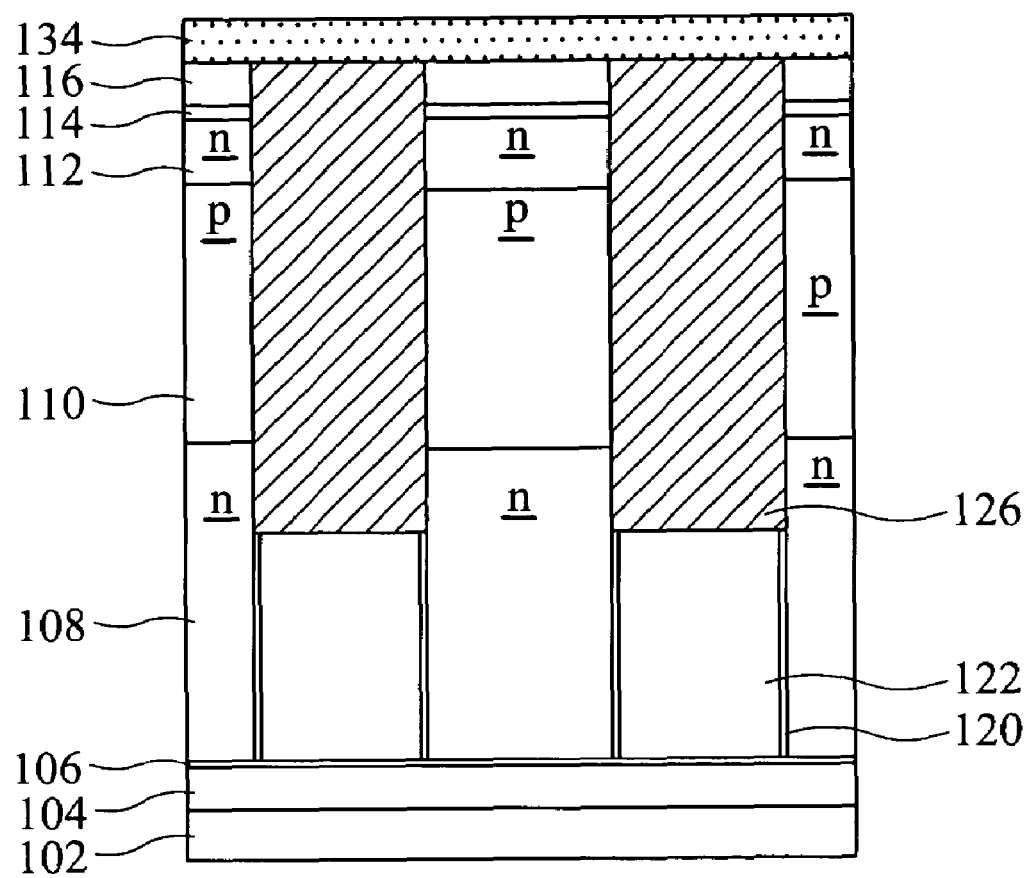

FIG. 8A is a top view of a layout of a memory device according to the invention, FIG. 8B is a cross section of a structure shown in FIG. 8A along the lines 8*b* to 8*b'*, and FIG. 8C is a cross section of a structure shown in FIG. 8A along the lines 8*c* to 8*c'*.

In one embodiment, insulating material 134 of silicon nitride is formed to fill the trench and cover the pillars 101 and insulating layer 126*a* for electrical isolation.

Figure 9A:
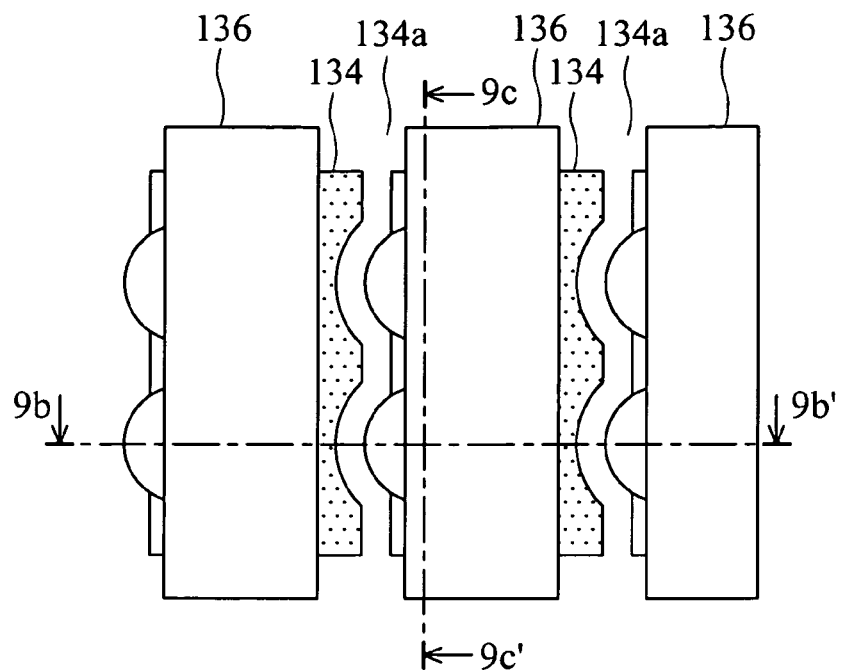
Figure 9B:
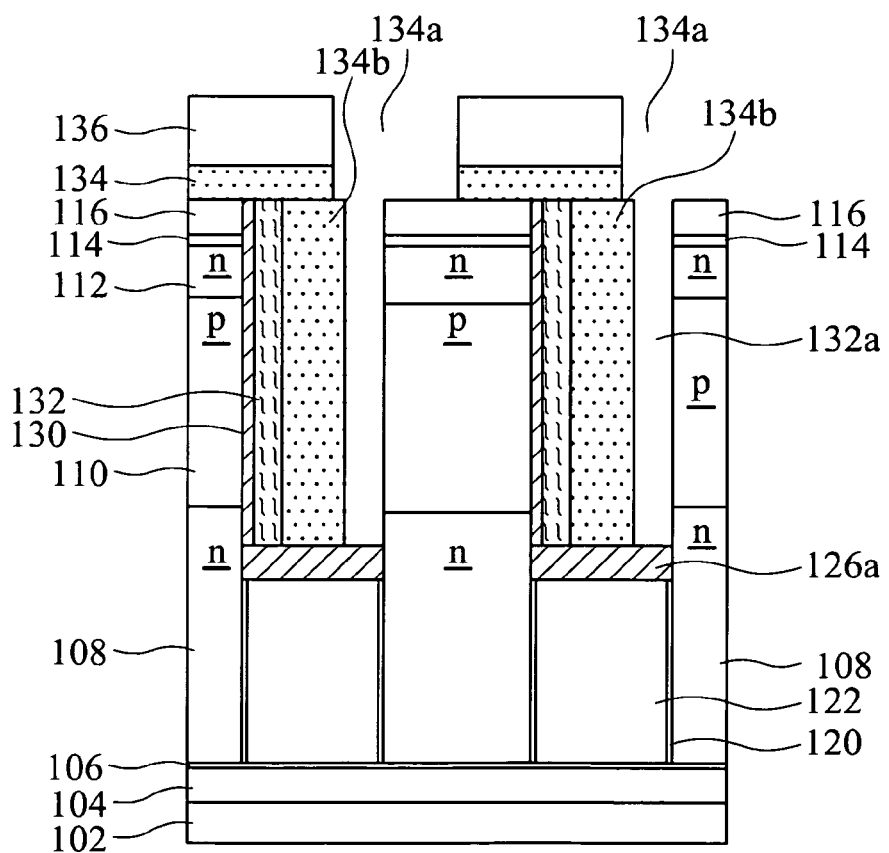
Figure 9C:
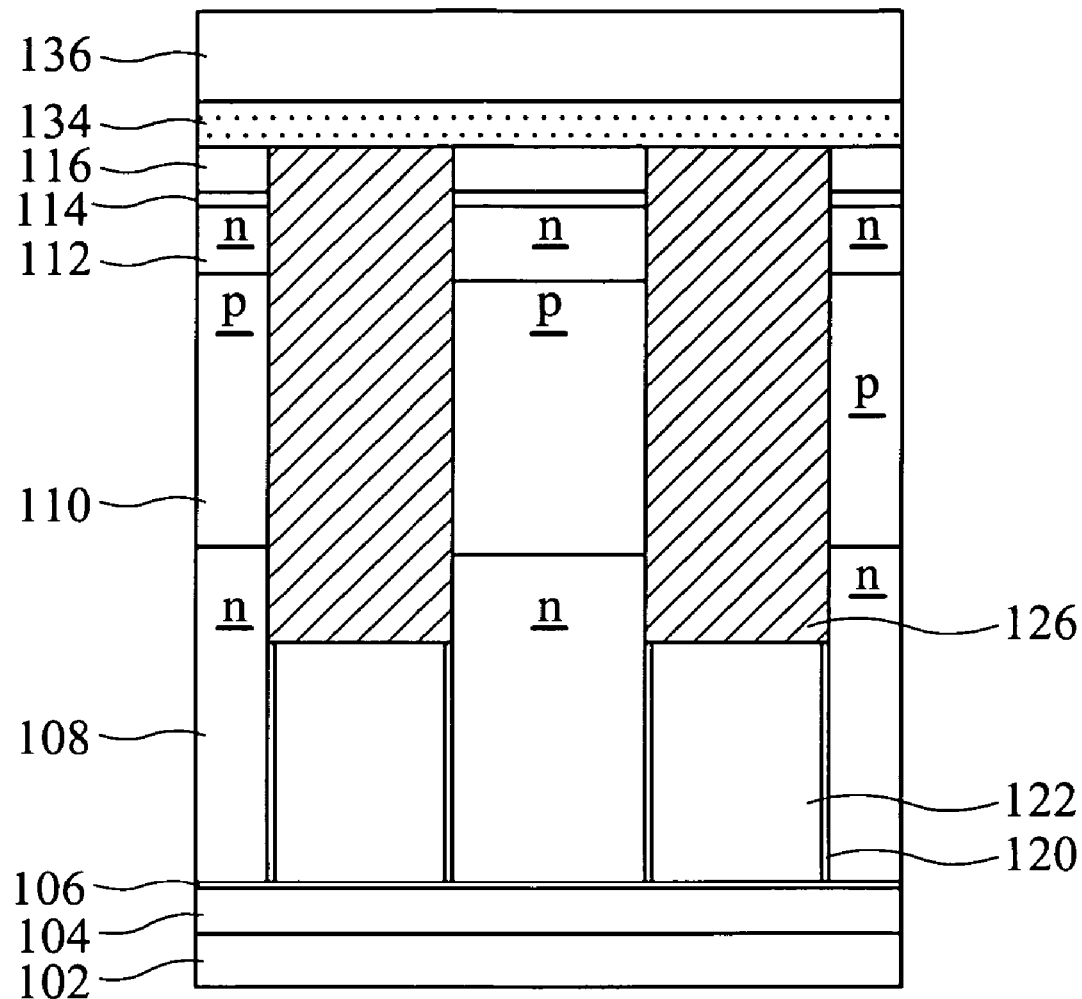

FIG. 9A is a top view of a layout of a memory device according to the invention, FIG. 9B is a cross section of a structure shown in FIG. 9A along the lines 9*b* to 9*b'*, and FIG. 9C is a cross section of a structure shown in FIG. 9A along the lines 9*c* to 9*c'*.

In one embodiment, a patterned photoresist layer 136 is formed on the insulating material 134. An opening 134*a* is formed in the insulating material 134 to expose a portion of the gate dielectric layer 130 and a gate conductive layer 132 using the patterned photoresist layer 136 as a mask. The exposed layers 130 and 132 are removed by etching. After etching, slots 132*a* are formed on the left sidewall of the pillars 101, and gate structures, also referred to as a word line (WL), are formed on the right sidewall of the pillar 101. In this embodiment, the gate structure comprises the gate dielectric layer 130 and gate conductive layer 132.

Figure 10A:
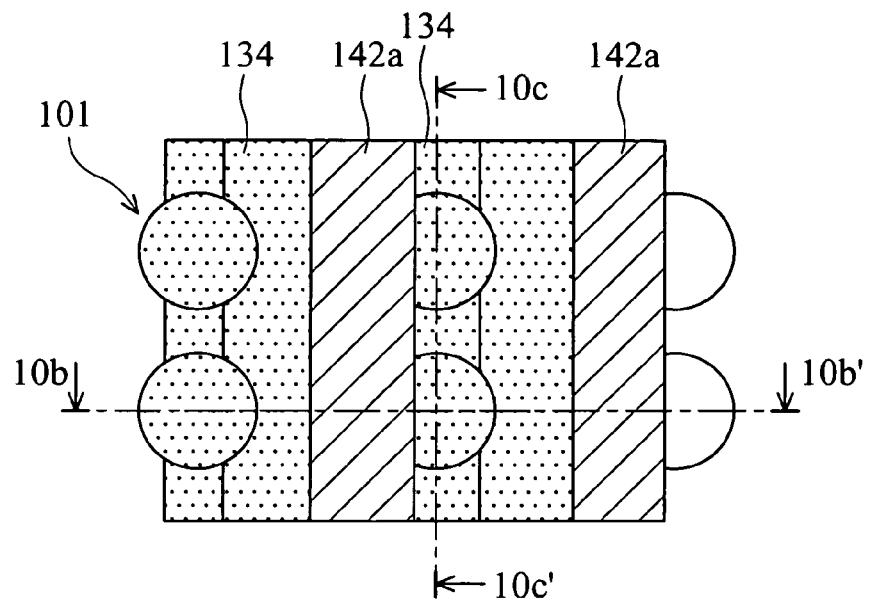
Figure 10B:
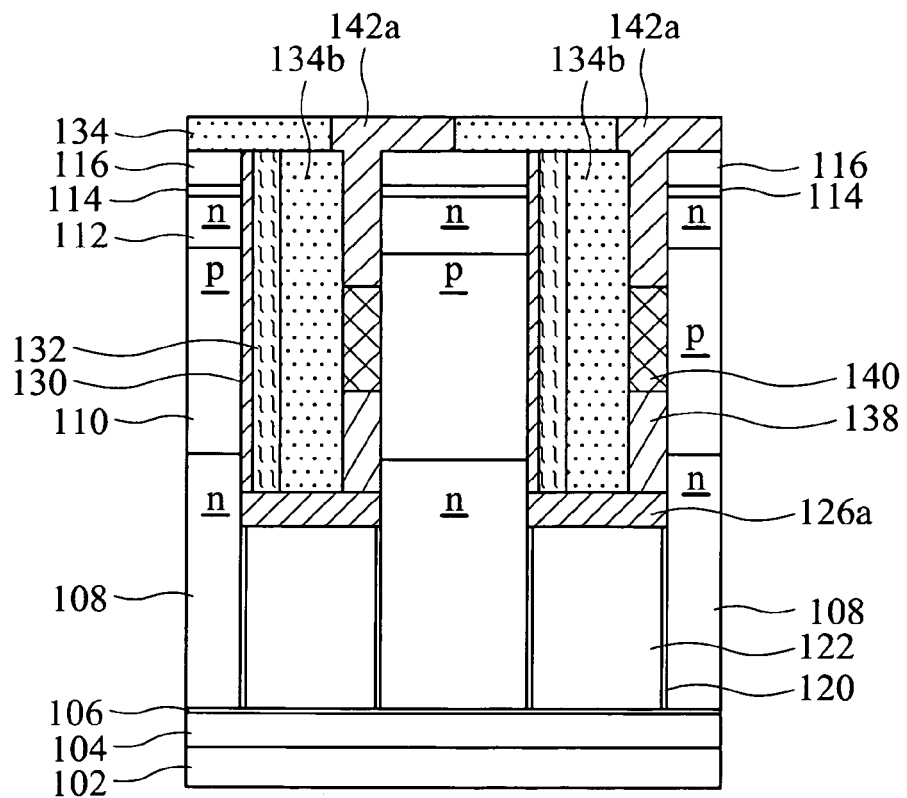
Figure 10C:
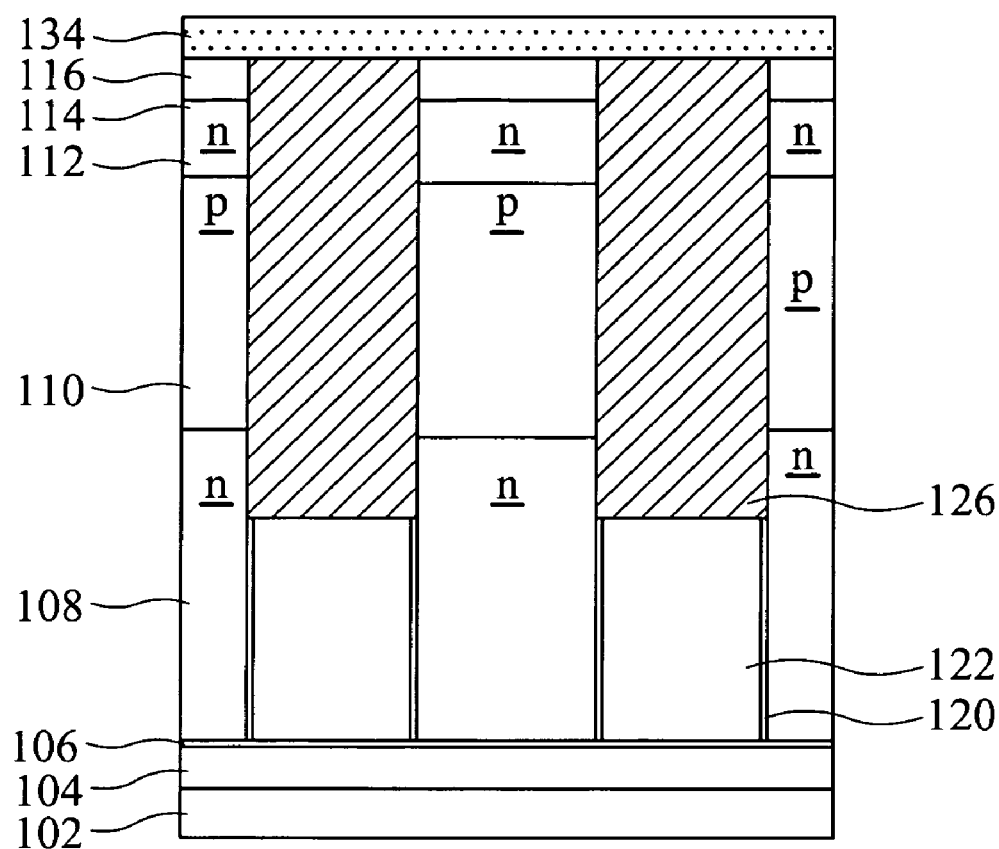

FIG. 10A is a top view of a layout of a memory device according to the invention, FIG. 10B is a cross section of a structure shown in FIG. 10A along the lines 10*b* to 10*b'*, and FIG. 10C is a cross section of a structure shown in FIG. 10A along the lines 10*c* to 10*c'*.

In one embodiment, the patterned photoresist layer 136 is removed, slots 132*a* are cleaned, and an insulating layer 138, conductive layer 140, and insulating material 142*a* are respectively formed in the slots 132.

In this embodiment, a polysilicon layer is deposited into a slot, a portion of the polysilicon layer is removed by recessing, and an insulating layer 138 is formed. The top surface of an insulating layer 138 can be higher than that of the first N type epitaxial silicon layer 108.

After the insulating layer 138 is formed, a conductive material, such as polysilicon, metal, or metal compound material is deposited into the slots. A portion of the conductive material is removed by recessing to a predetermined depth lower than the top surface of the P type epitaxial silicon layer 110, and a conductive layer 140, act as a body line, is formed on a-sidewall of the P type epitaxial silicon layer 110.

After the conductive layer 140 is formed, an insulating material 142*a*, such as silicon oxide, is deposited into the slots and planarized to expose the insulating material 134. The insulating material 142*a* is used for electrically isolation.

Figure 11A:
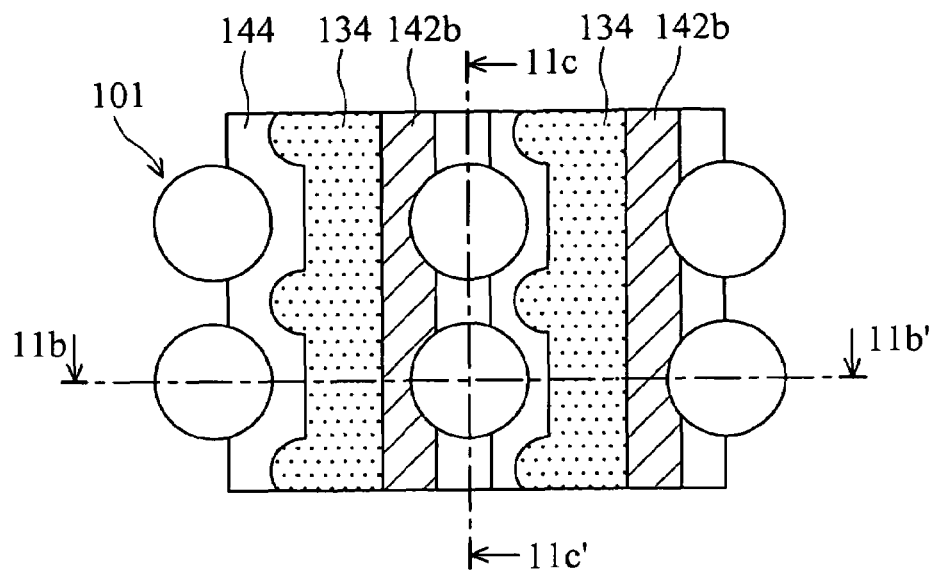
Figure 11B:
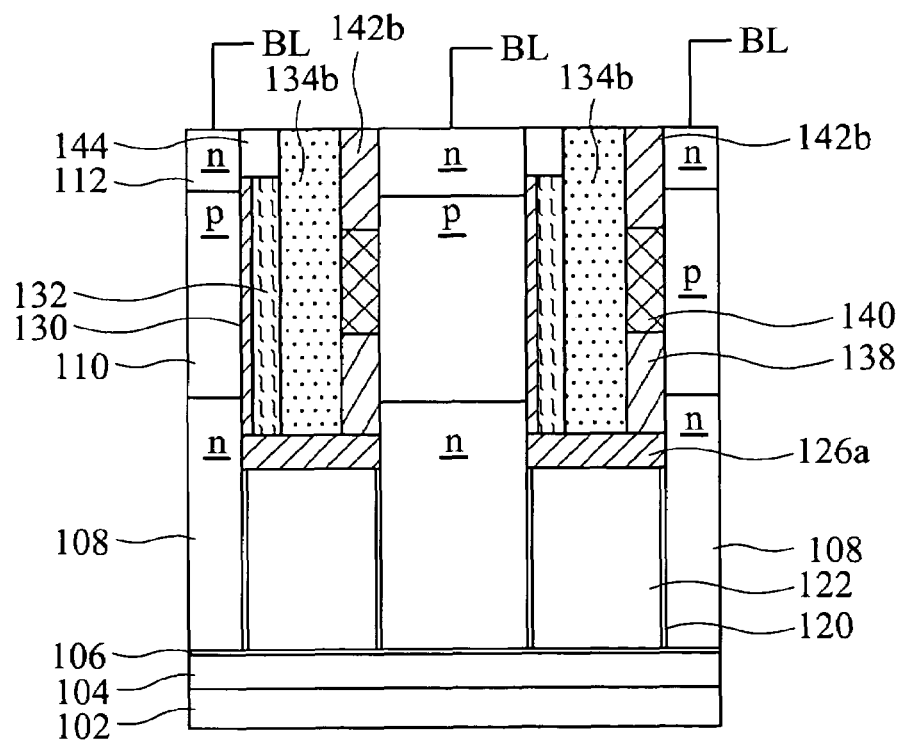
Figure 11C:
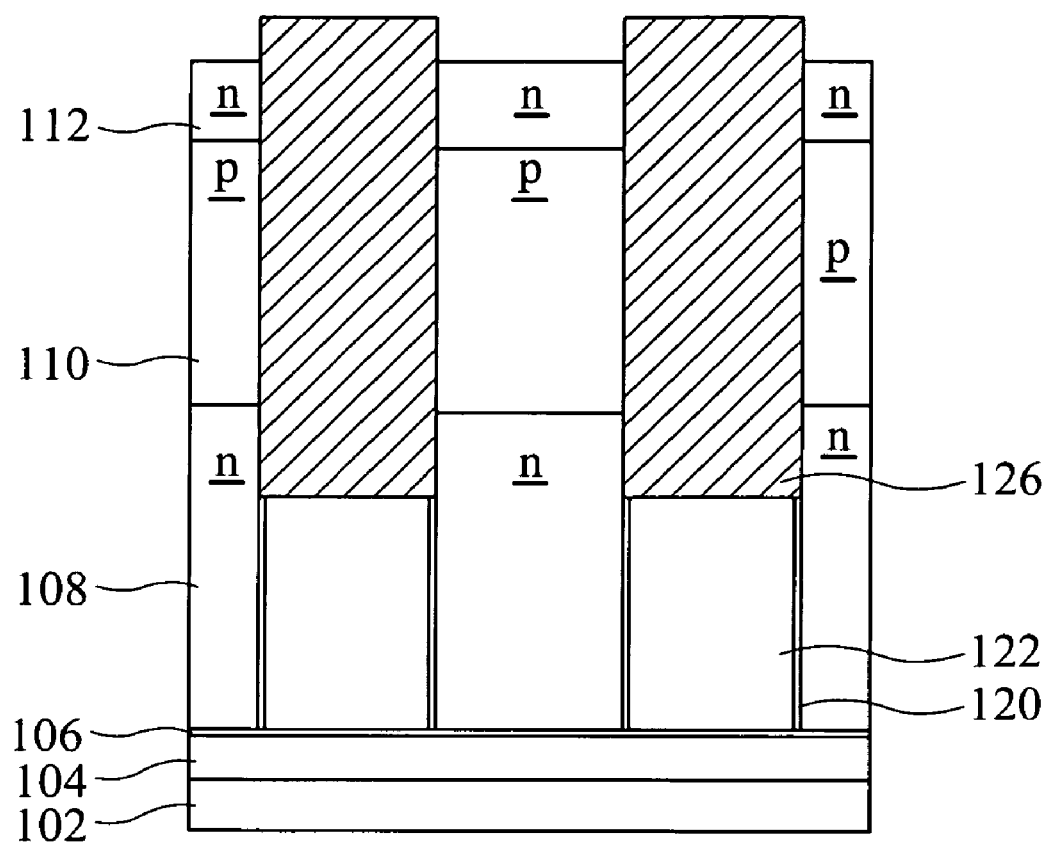

FIG. 11A is a top view of a layout of a memory device according to the invention, FIG. 11B is a cross section of a structure shown in FIG. 11A along the lines 11*b* to 11*b'*, and FIG. 11C is a cross section of a structure shown in FIG. 11A along the lines 11*c* to 11*c'*.

In one embodiment, insulating material 142*a* and 134 above the pad layers 114 and 116 as shown in FIG. 10B can be removed to expose the pad layer 116 and gate structure by etching or planarization. A portion of the gate structure is removed to a predetermined depth lower than the top surface of the second N type epitaxial silicon layer 112 by recessing, and a hole is formed. Pad layers 114 and 116 above the second N type epitaxial silicon layer 112 are removed, and the hole is filled with an interlayer dielectric layer (ILD) 144, such as silicon oxide.

After the ILD 144 is formed, bit lines are formed on a surface of the second source/drain region, such as the second N type epitaxial silicon layer 112.

Figure 12:
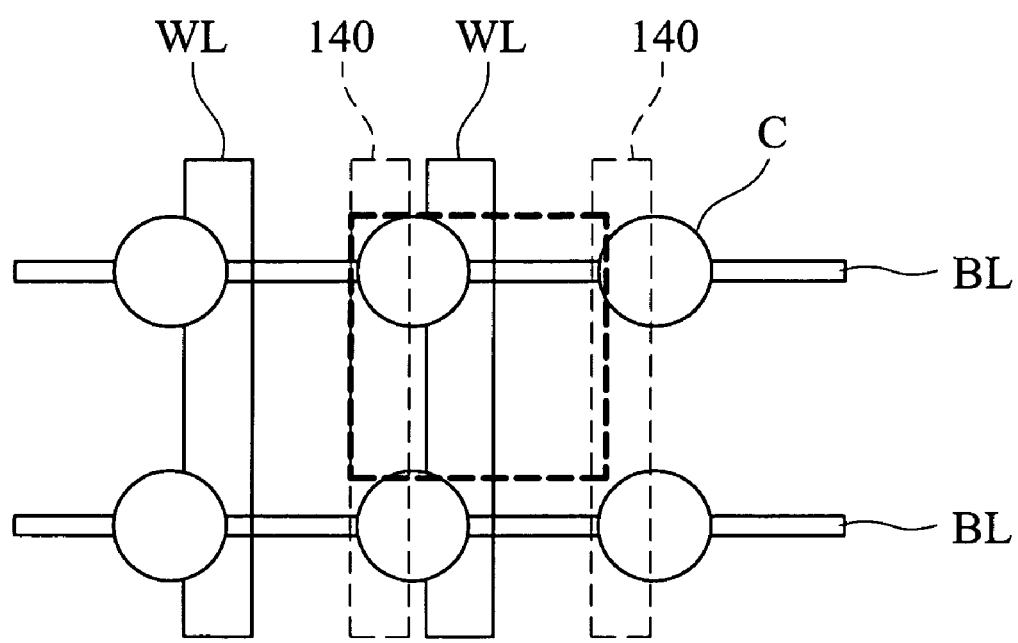
FIG. 12 is a top view of a $4F^2$ layout of a memory device according to the invention.

FIG. 12 is a top view of a 4F² layout of a memory device according to the invention. A memory device with surrounding gate transistor (SGT) according to the invention comprises word lines (WL), bit lines (BL) perpendicular to word lines, and body lines 140. A memory device using the layout as shown in FIG. 12 decreases by 50% the area of an array, can use open bit lines, and restricts the covered area of a mask, such that the floating body effect is decreased, current leakage is lowered, and is suitable for small-scale process, such as a 55 nm process.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of fabricating a memory device, comprising:
   providing a substrate;
   forming a plurality of pillars on the substrate, wherein each pillar has a plurality of epitaxial layers, a first sidewall and a second sidewall, and is sequentially defined to form a first source/drain region, a channel region, and a second source/drain region from a bottom of each pillar, a trench is disposed between the pillars, and the first source/drain region acts as a top electrode;
   forming a node dielectric layer on the first sidewall and the second sidewall, in a lower portion of the trench, and adjacent to the top electrode;
   forming a common bottom electrode in a lower portion of the trench and surrounded by the node dielectric layer;
   forming a first insulating layer on the common bottom electrode inside the trench;
   forming a double layer on the first sidewall and the second sidewall, above the first insulating layer, and inside the trench, wherein the double layer comprises a gate dielectric layer and a gate conductive layer;
   forming a second insulating layer in a space surrounded by the double layer inside the trench;
   removing a portion of the double layer on the first sidewall to form a plurality of slots on the first sidewall and a plurality of gate structures on the second sidewall;
   forming a third insulating layer in a lower portion of the slots;
   forming a body line on the third insulating layer inside the slots; and
   filling a fourth insulating layer into the slots.

2. The method of claim 1, wherein the substrate comprises a silicon-on-insulator (SOI) substrate.

3. The method of claim 1, wherein forming the pillars comprises:
   forming a first N type epitaxial silicon layer on the substrate;
   forming a P type epitaxial silicon layer on the first N type epitaxial silicon layer;
   forming a second N type epitaxial silicon layer on the P type epitaxial silicon layer;
   forming a pad layer on the second N type epitaxial silicon layer;
   patterning the pad layer, the second N type epitaxial silicon layer, the P type epitaxial silicon layer, and the first N type epitaxial silicon layer to form the pillars, wherein the trench is disposed between the pillars.

4. The method of claim 1, wherein the common bottom electrode comprises a first conductive layer.

5. The method of claim 4, wherein forming the first conductive layer comprises:
   depositing a polysilicon material to fill the trench and cover the substrate;
   planarizing the polysilicon material; and
   recessing a portion of the polysilicon material to form a polysilicon layer, wherein the polysilicon layer is disposed in a lower portion of the trench and surrounded by the node dielectric layer.

6. The method of claim 5, wherein forming the first conductive layer further comprises:
   performing a ion implantation on the first conductive layer.

7. The method of claim 1, wherein forming the first insulating layer comprises:
   forming a silicon oxide material on the common bottom electrode inside the trench;
   forming a patterned silicon nitride layer on the pillars; and
   etching a portion of the silicon oxide material using the patterned silicon nitride layer as a mask to form the first insulating layer on the common bottom electrode.

8. The method of claim 1, wherein the gate dielectric layer is disposed adjacent to a sidewall of the pillars, and the gate conductive layer is disposed adjacent to the gate dielectric layer.

9. The method of claim 8, wherein the gate conductive layer comprises polysilicon.

10. The method of claim 1, wherein the second insulating layer comprises silicon nitride.

11. The method of claim 1, wherein forming the second insulating layer, the slots, and the gate structures comprise:
    filling a second insulating material on the substrate and in a space surrounded by the double layer inside the trench;
    patterning the second insulating material to form the second insulating layer; and
    removing a portion of the double layer on the first sidewall, using the second insulating layer as a mask, to form a plurality of slots on the first sidewall and a plurality of gate structures on the second sidewall.

12. The method of claim 11, wherein filling the fourth insulating layer into the slots comprises:
    filling a fourth insulating material into the slots and covering the substrate; and
    planarizing the fourth insulating material to form the fourth insulating layer.

13. The method of claim 12, wherein forming the pillars comprises:
    forming a pad layer on the epitaxial layers;
    patterning the pad layer and the epitaxial layers to form the pillars, wherein the trench is disposed between the pillars.

14. The method of claim 13, further comprising removing the second insulating layer and the fourth insulating layer above the gate conductive layer to expose a surface thereof.

15. The method of claim 14, further comprising removing a portion of the gate conductive layer to a predetermined depth lower than a top surface of the second source/drain region to form a recess, and filling an interlayer dielectric layer into the recess.

16. The method of claim 15, further comprising removing the pad layer to expose a surface of the second source/drain region after filling the interlayer dielectric layer into the recess.

17. The method of claim 16, further comprising forming a bit line on a surface of the second source/drain region.

18. The method of claim 1, wherein the third insulating layer is a silicon oxide layer.

19. The method of claim 18, wherein forming the silicon oxide layer in a lower portion of the slots comprises:
depositing a silicon oxide material into the slots; and
recessing the silicon oxide material to form the silicon oxide layer.

20. The method of claim 1, wherein the body line is a second conductive layer.

21. The method of claim 20, wherein the second conductive layer comprises polysilicon, metal, or metal compound.

22. The method of claim 20, wherein forming the second conductive layer in the slots comprises:
depositing a second conductive material into the slots; and
recessing the second conductive material to form the second conductive layer.

23. The method of claim 22, wherein the second conductive layer has a top surface lower than a top surface of the channel region.

24. The method of claim 1, wherein the fourth insulating layer comprises silicon oxide.

25. A memory device, comprising:
a substrate;
a plurality of pillars disposed on the substrate, wherein each pillar has a plurality of epitaxial layers, a first sidewall and a second sidewall, and is sequentially defined to form a first source/drain region, a channel region, and a second source/drain region from a bottom of each pillar, and the first source/drain region acts as a top electrode;
a trench disposed between the pillars;
a node dielectric layer disposed in a lower portion of the trench and adjacent to the top electrode;
a common bottom electrode disposed in a lower portion of the trench and surrounded by the node dielectric layer;
a first insulating layer disposed on the common bottom electrode inside the trench;
a plurality of gate structures disposed on the first sidewall and inside the trench;
a second insulating layer disposed inside the trench and adjacent to the gate structures; and
a third insulating layer, body line, and fourth insulating layer respectively disposed on the substrate and located between the second insulating layer and the second sidewall.

26. The device of claim 25, wherein the substrate comprises a silicon-on-insulator (SOI) substrate.

27. The device of claim 25, wherein the epitaxial layers comprise:
a first N type epitaxial silicon layer disposed on the substrate;
a P type epitaxial silicon layer disposed on the first N type epitaxial silicon layer; and
a second N type epitaxial silicon layer disposed on the P type epitaxial silicon layer.

28. The device of claim 25, wherein the common bottom electrode comprises a first conductive layer.

29. The device of claim 28, wherein the first conductive layer comprises polysilicon.

30. The device of claim 25, wherein the first insulating layer comprises silicon oxide.

31. The device of claim 25, wherein each gate structure comprises a gate dielectric layer and a gate conductive layer.

32. The device of claim 31, wherein the gate conductive layer comprises polysilicon.

33. The device of claim 25, wherein the second insulating layer comprises silicon nitride.

34. The device of claim 25, further comprising an interlayer dielectric layer, disposed on a sidewall of the second source/drain region inside the trench to cover the gate structures.

35. The device of claim 25, further comprising a plurality of bit lines disposed on a surface of the second source/drain region.

36. The device of claim 25, wherein the third insulating layer comprises silicon oxide.

37. The device of claim 25, wherein the body line is a second conductive layer.

38. The device of claim 37, wherein the second conductive layer comprises polysilicon, metal, or metal compound.

39. The device of claim 37, wherein the second conductive layer has a top surface lower than a top surface of the channel region.

40. The device of claim 25, wherein the fourth insulating layer comprises silicon oxide.

* * * * *